United States Patent [19]

Bombal et al.

[11] Patent Number: 5,960,052
[45] Date of Patent: Sep. 28, 1999

[54] LOW POWER SCANNABLE COUNTER

[75] Inventors: Jerome Bombal, Nice; Laurent Souef, Mouans Sartoux, both of France

[73] Assignee: VLSI Technology, Inc., San Jose, Calif.

[21] Appl. No.: 09/062,312
[22] Filed: Apr. 17, 1998
[51] Int. Cl.$^6$ .................................................. G06M 3/00
[52] U.S. Cl. ............................................ 377/29; 377/116
[58] Field of Search ....................................... 377/29, 116

[56] References Cited

U.S. PATENT DOCUMENTS

| 5,185,769 | 2/1993 | Wang | 377/29 |
| 5,339,343 | 8/1994 | Hashimoto et al. | 377/29 |
| 5,651,040 | 7/1997 | Yu | 377/29 |
| 5,740,219 | 4/1998 | O'Dell | 377/29 |

Primary Examiner—Margaret R. Wambach
Attorney, Agent, or Firm—LaValle D. Ptak

[57] ABSTRACT

A low power scannable asynchronous counter which is fully testable and which consumes low power in a functional mode consists of counter cells cascaded through NOR gate circuits to which clock signals are applied for each of the stages or cells. Each of the stages or cells comprises a flip-flop and a multiplexer which together operate as a toggle flip-flop only when all of the previous flip-flops are set. The result is that the flip-flop clock is forced high preventing any transition of the flip-flop internal clock tree for all stages or cells where the output is low. Thus, no power consumption of such stages takes place during functional operation. In the scan test mode, the counter operates as a shift register and it is fully testable.

18 Claims, 3 Drawing Sheets

5,960,052

LOW POWER SCANNABLE COUNTER

BACKGROUND

In the production of integrated circuit chips, it is important that all of the various circuits on the integrated circuit chips are tested prior to incorporating the various chips into completed systems. As the complexity of integrated circuit chips increases, the difficulty of performing one hundred percent testing of all of the circuit components becomes challenging. One area where such 100% testing has been difficult is in the testing of asynchronous ripple counters. Generally, such ripple counters are not scannable, because only one flip-flop in the counter chain is connected to the master clock. Synchronous counters, in contrast, are easily scannable; but these counters consume significant amounts of power, since all of the flip-flops are connected to the master clock.

In order to test asynchronous counters, the counters generally are split into a plurality of four-bit counters tested in partial scan methodology. Since skew problems arise in deep sub-micron technology, the designers of such counters are forced to insert lockup latches between the scan elements. This leads to a large amount of added gates and even greater power consumption, since the lockup latches consume power in their functional mode.

It is desirable to design a low power scannable asynchronous counter which overcomes the disadvantages of the prior art, which is easy to scan, which is one hundred percent testable, and which consumes low power in its functional operating mode.

SUMMARY OF THE INVENTION

It is an object of this invention to provide an improved low power scannable asynchronous counter.

In accordance with a preferred embodiment of this invention, a low power scannable asynchronous counter capable of full testability is constructed having an input stage or cell and an output stage or cell, and any desired number of intermediate stages or cells. All of the intermediate stages have carry inputs and carry outputs. Each of the stages include a flip-flop with normal and inverted outputs; and each of the stages is supplied with an inverted clock input and data input. Each stage also includes a multiplexer, which has an output coupled to the data input of the flip-flop, a first input coupled with the inverted output of the flip-flop and a second input coupled with a data input signal. A selector input for the multiplexer is coupled with a source of scan mode signals; and all of the intermediate stages and the tail or final stage include a gate circuit having three inputs, one of which is coupled with the source of scan mode signals, another of which is coupled with a source of inverted clock signals derived from the output of the preceding stage, and a third which is coupled with the source of input clock signals. The output of the gate circuit is coupled with the clock input of the flip-flop in each of the stages. This arrangement operates in its functional mode as a ripple counter. In its test mode, the counter behaves as a shift register; and the modes are selected by the state of the scan mode signal.

DETAILED DESCRIPTION

Figure 1:
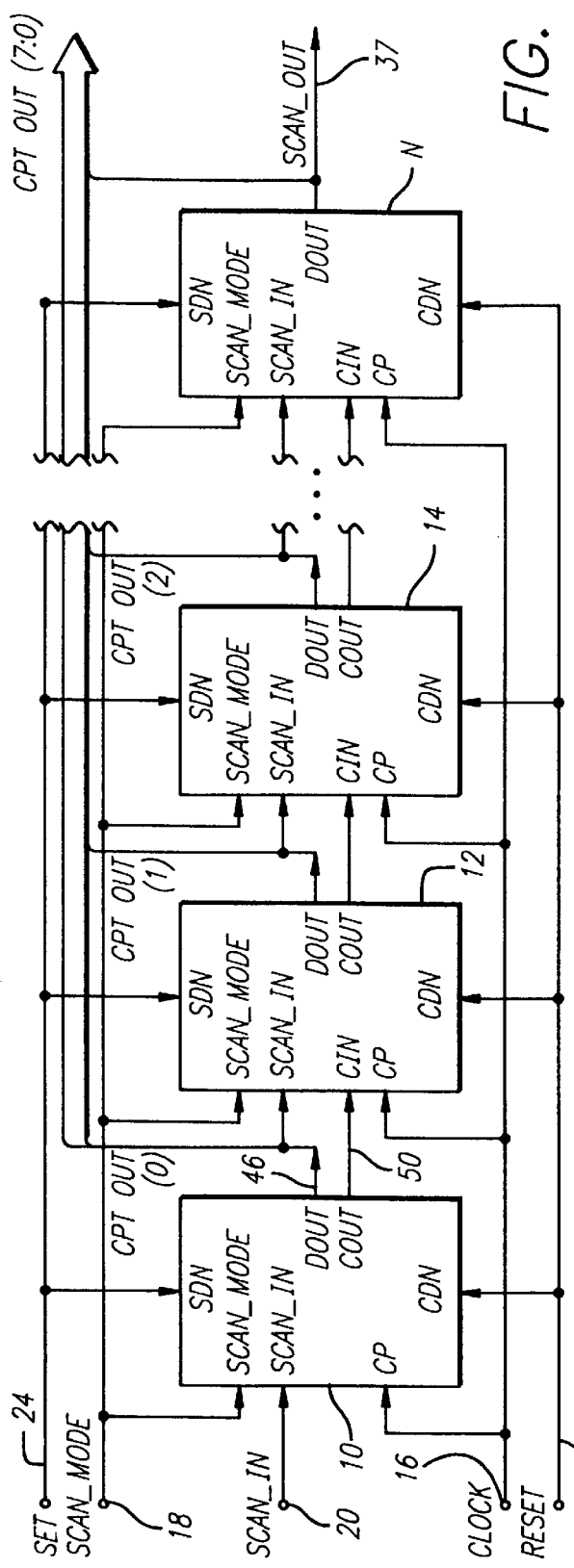
FIG. 1 is a schematic diagram of an asynchronous counter made in accordance with a preferred embodiment of the invention.

Reference now should be made to the drawings, in which the same reference numbers are used in the different figures to designate the same components. FIG. 1 is a circuit diagram of a scannable asynchronous digital counter in accordance with a preferred embodiment of the invention. The counter can include any number of N stages which are interconnected in its functional mode in any desired counter configuration.

In the illustration shown in FIG. 1, the functional mode of the counter is a ripple counter; and the various stages 10, 12, 14 and N operate as toggle flip-flops only when all of the previous flip-flops in the earlier stages are set, that is when the C-OUT output goes high. This output constitutes the C-IN input for the next succeeding stage (rising edge). Because of this configuration, the flip-flop clock is forced high, preventing any transition in the flip-flop internal clock tree and, thus, no power consumption. Since the input fan-in of the clock signal CP is 1, no extra capacitance is added to the cell or stage input.

When the circuit of FIG. 1 is operated in the functional mode, the scan mode signal applied to a terminal 18 is low. The scan in signal applied to the terminal 20 shown in FIG. 1 constitutes the data input to the first cell or stage 10 of the counter. The outputs from each of the cells or stages 10, 12, 14, N are obtained on the output terminals 46 from the D-OUT outputs. It should be noted that the output signal D-OUT for each cell or stage constitutes the "SCAN IN" or data signal for the next succeeding stage for all stages, except the first stage which obtains its input from the scan in or data input terminal 20.

As illustrated in FIG. 1, the counter also may be reset to an initial cleared or "0" condition by the application of a reset pulse on terminal 22. This pulse is applied in parallel to all of the different cells or stages 10, 12, 14 through N. Similarly, the counter may be preset with a predetermined count through a set pulse applied over a lead 24.

Figure 2:
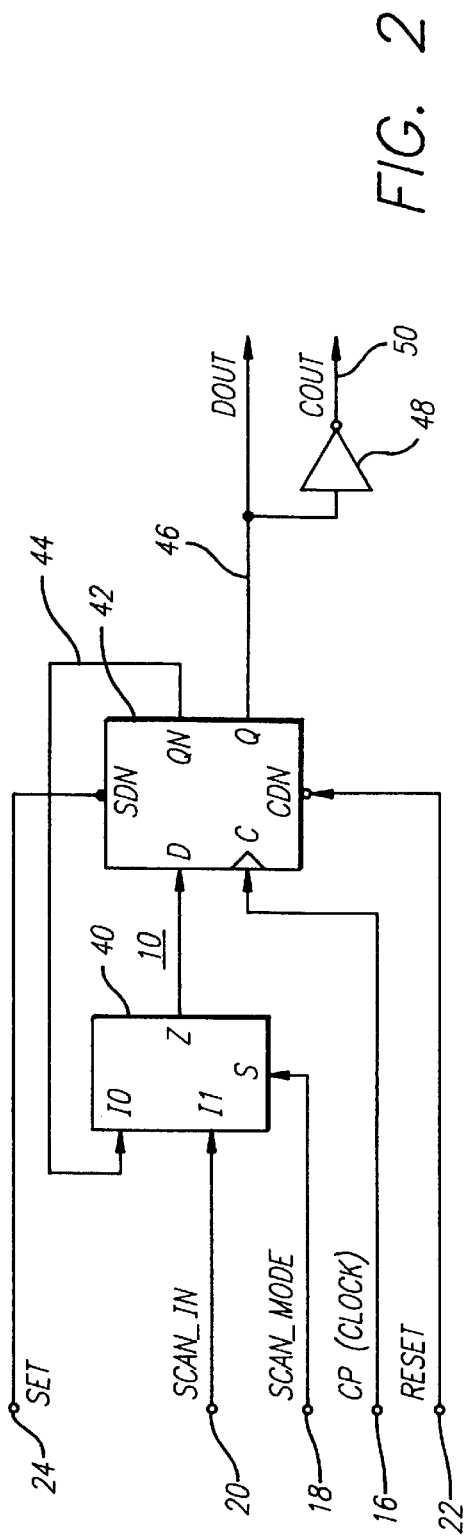
FIG. 2 is a detailed circuit drawing of the head or input stage or cell of the embodiment shown in FIG. 1.
Figure 3:
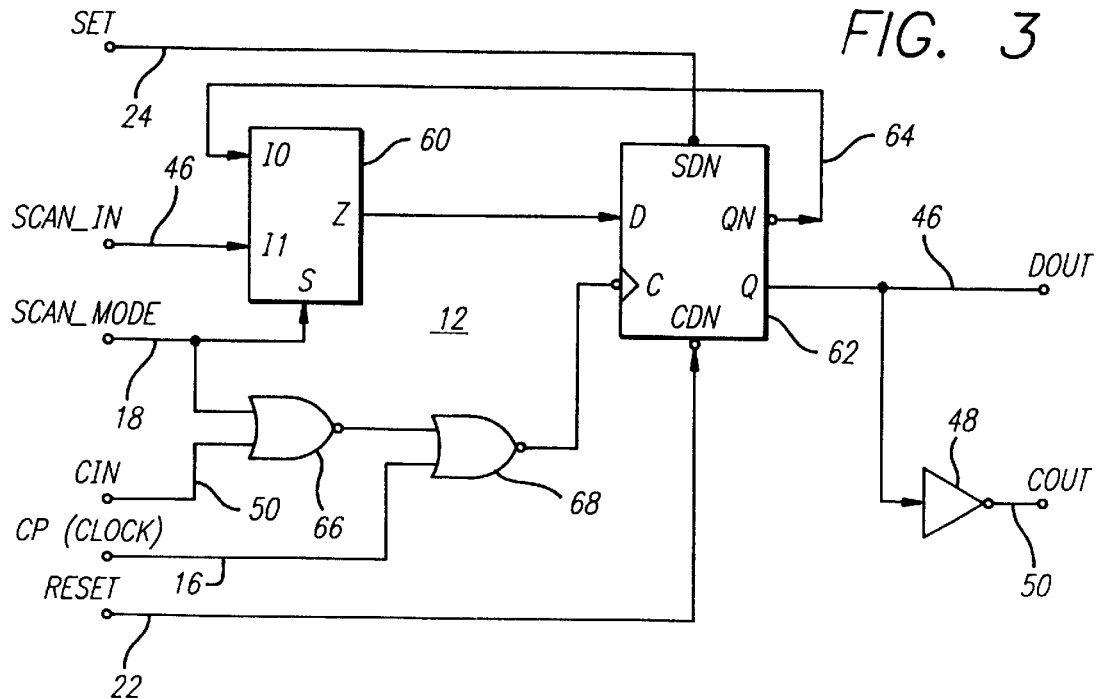
FIG. 3 is a detailed circuit diagram of the intermediate stages or cells of the counter of FIG. 1.
Figure 4:
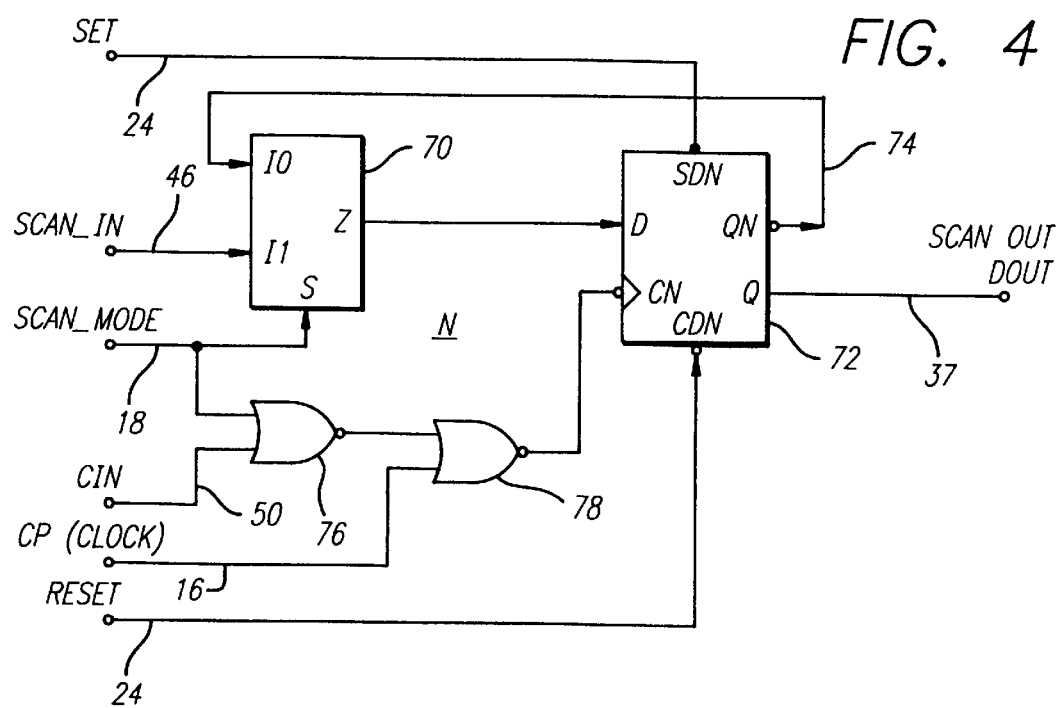
FIG. 4 is a detailed circuit diagram of the tail or end stage or cell of the preferred embodiment of the circuit shown in FIG. 1.

FIG. 2 is a block diagram of the head or input cell or stage 10 of the counter. FIG. 3 is a block diagram of one of the several identical intermediate cells or stages, such as the cell 12. Finally, FIG. 4 is a block diagram of the output stage or cell N. All of the cells initially may be constructed in an identical manner to the intermediate cell shown in FIG. 3. Since the head cell does not receive any input from a preceding cell, the NOR gate circuitry which is shown in FIGS. 3 and 4 is not required in the head cell of FIG. 1. Since the cells all may be identically constructed, however, such circuitry may be present in the head cell 10. For the head cell 10, the "CIN" input may be tied to VDD, leading to a regular scan flip-flop implementation. The result of doing this is the actual functional configuration of the input cell or stage 10, as shown in FIG. 1.

As shown in FIG. 1, the input stage or cell 10 includes a two input multiplex circuit 40 and a flip-flop 42. The flip-flop 42 has a normal output Q and an inverted output QN, a data input D, a clock input CN, a reset input CDN and a set input SDN. The inverted output QN is applied over a lead 44 to one of the two inputs of the multiplex circuit 40 (IO). The second input (I1) to the multiplexer 40 is the scan data input applied over the terminal 20. The particular one of these two inputs of the multiplexer circuit 40, which is passed through to its output Z, is established by the scan mode signal applied over the terminal 18. The counter operates in its functional or operational mode when the signal on the scan mode input 18 is low.

For the intermediate stages or cells 12, 14 and all others up to the final stage or cell N, the circuit of FIG. 3 is the operational configuration which is employed. This circuit also employs a two input multiplexer 60 and a flip-flop 62, which operate and are interconnected in identical manner to the corresponding multiplexer 40 and flip-flop 42 of the head or input stage or cell 10. The circuit of FIG. 3, however, receives is "scan in" or data input to the I.1 input of the multiplexer 60 from the normal (Q) D-OUT output signal 46 of the preceding stage, as indicated in FIG. 1 and as shown in FIG. 2.

The clock input for the intermediate stage 12 shown in FIG. 3 is controlled by the inverted output signal on the lead 46 which is supplied through an inverter 48 over a lead 50 (or from the QN output on the lead 44) to constitute the signal "C-OUT" of each preceding stage. This "C-OUT" signal on the lead 50 constitutes the "C-IN" input 50 shown in FIG. 3 (and also in FIG. 4). The operation of the circuit of FIG. 3 is the same as the one shown for the head cell of FIG. 2.

The clock signal for the flip-flop 62, however, applied to the inverted clock input CN is obtained from the output of a NOR gate 68 having two inputs. One of these inputs is the master clock signal (CP) applied over the lead 16. The other input to the NOR gate 68 is obtained from the output of a second NOR gate 66, which receives inputs from the scan mode input terminal 18 and from the C-IN signal 50 on the next preceding stage of the counter.

The final or tail cell N shown in FIG. 4 is identical to the cell of FIG. 3, except that there is no need for the C-OUT output over the lead 50 obtained from the inverter 48 shown in FIG. 3. It should be noted, however, that while the head cell of FIG. 2, the intermediate cells shown as a representative of Cell 12 of FIG. 31 and the final or tail cell of FIG. 4 are illustrated with slightly different configurations, all of them can be constructed with the same circuitry shown for the intermediate cell of FIG. 3. The head cell then would simply have the C-IN 50 connected to VDD as described above, thereby essentially removing the function of the NOR gate 66 from the circuit. This then permits the clock signals applied over the lead 16 to pass through the gate 68 to the clock input CN of the flip-flop 62 in the same manner as illustrated in FIG. 2 for the head cell. As noted, the only difference between the tail or final cell shown in FIG. 4 from the intermediate cell of FIG. 3 is the elimination of the inverter 48 and the output count, since there is no ripple or carryover to a next succeeding cell from the tail cell illustrated in FIG. 4. The output of the tail cell N also constitutes a signal shown as SCAN-OUT in the timing diagram of FIG. 5 and one bit of the signal on the CPTOUT bus.

Figure 5:
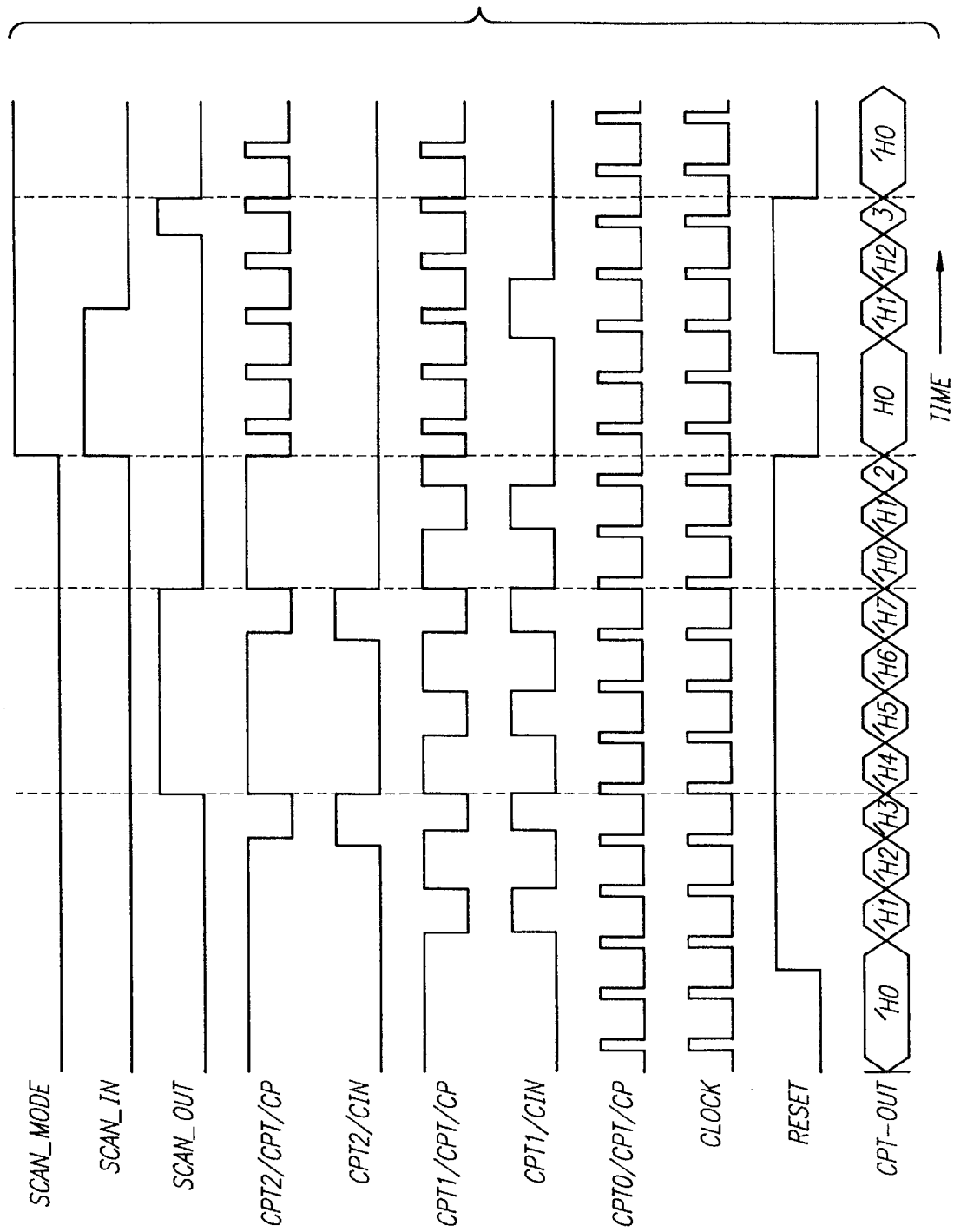
FIG. 5 is a timing diagram showing the interrelationships of the various signals in the operation of the asynchronous counter shown in FIGS. 1 through 4.

The timing diagram of FIG. 5 illustrates the waveforms of various signals passing through the counter shown in FIG. 1 under the control of the scan mode signal. The signals are provided with the same designations used in FIG. 1. In the portion of the timing diagram shown in FIG. 5 where the Scan Mode signal is low, the counter of FIG. 1 is operating as a conventional ripple counter; and the various signals shown in FIG. 5 are present at the correspondingly identified inputs and outputs of the counter blocks 10, 12, 14 to N, as illustrated. In FIG. 5 the CPT OUT portion of the timing diagram is shown for an eight-stage ripple counter. The number of stages of the counter shown in FIG. 1 using the different configurations of FIGS. 2, 3 and 4 may be varied, however, depending upon the particular application for the counter which is desired.

When the counter is to be operated in the test mode, the scan mode signal applied over the lead 18 to each of the stages 10, 12, 14 and N is high. When this occurs, the counter behaves as a shift register. The clock input on the input terminal 16 then is connected to the flip-flop clock for each of the stages to allow data shifting. The skew issues are solved, since each cell or stage of the counter is implemented in a fixed layout; and all of the cells receive the same clock, that is the clock signal which is present on the input 16, as is apparent from an examination of FIGS. 2, 3 and 4.

The circuit which is illustrated in FIGS. 1 through 4 is 100% testable. That is, all of the stages of the counter may be completely tested, even if the counter output bus is not observable, which is the case in most applications. It should also be noted that the complete 100% test coverage is not affected by the counter length; and the vector count is very low, giving the ability to design high capacity counters. This also saves tester time. The design produces excellent stability of the generated vectors, both on re-simulation and silicon and is very good even with great deratings. As a consequence, a test engineer may be confident when taking the vector set to the tester. This is not always the case with conventional asynchronous design-for-test styles of counters.

The circuit which has been shown and described combines both the advantages of synchronous counters pertaining to their testability and vectors count, and the advantages of asynchronous counters in terms of power saving. This is accomplished with the use of the multiplexers 40, 60 and 70 and an additional NOR gate. This amounts to the equivalent of a one-gate increase from a conventional synchronous counter. This trade off in real estate is relatively insignificant compared to the power savings which result from the use of the asynchronous counter operating in its functional mode.

The foregoing description of the preferred embodiment of the invention is to be considered as illustrative and not as limiting. Various changes will occur to those skilled in the art for performing substantially the same function, in substantially the same way, to achieve substantially the same result, without departing from the true scope of the invention as defined in the appended claims.

What is claimed is:

1. A low power scannable asynchronous counter including in combination:
   a source of clock signals;
   a source of scan data input signals;
   a source of scan mode signals;
   a head cell having (a) a first flip-flop with normal and inverted outputs, a clock input, and a data input, and (b) a first multiplexer with an output coupled to the data input of said first flip-flop, a first input coupled with the inverted output of said first flip-flop, a second input coupled with said source of scan data input signals, and a selector input coupled with said source of scan mode signals;
   at least one intermediate cell having (a) a second flip-flop with normal and inverted outputs, a clock input, and a data input, and (b) a second multiplexer with an output coupled to the data input of said second flip-flop, a first input coupled with the inverted output of said second flip-flop, a second input coupled with the normal output of said first flip-flop, and a selector input coupled with said source of scan mode signals; and (c) a first gate circuit with a first input coupled with said source of scan mode signals, a second input coupled with the inverted normal output of said first flip-flop, a third input coupled with said source of clock signals, and an output coupled to the clock input of said second flip-flop.

2. The combination according to claim 1 further including a tail cell having (a) a third flip-flop with normal and inverted outputs, a clock input and a data input, and (b) a third multiplexer with an output coupled to the data input of said third flip-flop, a first input coupled with the inverted output of said third flip-flop, a second input coupled with the normal output of said second flip-flop of the immediately preceding one of said intermediate cells, and a selector input coupled with said source of scan mode signals, and (c) a second gate circuit with a first input coupled with the inverted normal output of the immediately preceding one of said intermediate cells, a second input coupled with said source of clock-signals, a third input coupled with said source of scan mode signals, and having an output coupled to the clock input of said third flip-flop.

3. The combination according to claim 2 wherein said first gate circuit comprises a NOR gate circuit.

4. The combination according to claim 3 wherein said second gate circuit comprises a NOR gate circuit.

5. The combination according to claim 4 wherein said at least one intermediate cell comprises N intermediate cells interconnected between said head cell and said tail cell in cascade, with the normal output of the second flip-flop of each intermediate cell connected to the second input of the second multiplexer of the next succeeding cell and the inverted normal output of the second flip-flop of each of said intermediate cells being connected with the gate circuit of the next succeeding cell in said counter.

6. The combination according to claim 1 wherein said first gate circuit comprises a NOR gate circuit.

7. The combination according to claim 6 wherein said at least one intermediate cell comprises N intermediate cells interconnected between said head cell and said tail cell in cascade, with the normal output of the second flip-flop of each intermediate cell connected to the second input of the second multiplexer of the next succeeding cell and the inverted normal output of the second flip-flop of each of said intermediate cells being connected with the gate circuit of the next succeeding cell in said counter.

8. The combination according to claim 1 wherein said at least one intermediate cell comprises N intermediate cells interconnected between said head cell and said tail cell in cascade, with the normal output of the second flip-flop of each intermediate cell connected to the second input of the second multiplexer of the next succeeding cell and the inverted normal output of the second flip-flop of each of said intermediate cells being connected with the gate circuit of the next succeeding cell in said counter.

9. The combination according to claim 8 further including a tail cell having (a) a third flip-flop with normal and inverted outputs, a clock input and a data input, and (b) a third multiplexer with an output coupled to the data input of said third flip-flop, a first input coupled with the inverted output of said third flip-flop, a second input coupled with the normal output of said second flip-flop of the immediately preceding one of said intermediate cells, and a selector input coupled with said source of scan mode signals, and (c) a second gate circuit with a first input coupled with the inverted normal output of the immediately preceding one of said intermediate cells, a second input coupled with said source of clock signals, a third input coupled with said source of scan mode signals, and having an output coupled to the clock input of said third flip-flop.

10. The combination according to claim 1 wherein said counter configuration operates as a ripple counter when the signal on said source of scan mode signals is low.

11. The combination according to claim 10 wherein said counter comprises a scan-chain when the signal on said source of scan mode signals is high.

12. The combination according to claim 1 further including a source of pre-set signals coupled with said flip-flops.

13. The combination according to claim 1 further including a source of set signals coupled with said flip-flops.

14. The combination according to claim 11 further including a source of pre-set signals coupled with said flip-flops.

15. The combination according to claim 14 further including a source of set signals coupled with said flip-flops.

16. The combination according to claim 15 further including a tail cell having (a) a third flip-flop with normal and inverted outputs, a clock input and a data input, and (b) a third multiplexer with an output coupled to the data input of said third flip-flop, a first input coupled with the inverted output of said third flip-flop, a second input coupled with the normal output of said second flip-flop of the immediately preceding one of said intermediate cells, and a selector input coupled with said source of scan mode signals, and (c) a second gate circuit with a first input coupled with the inverted normal output of the immediately preceding one of said intermediate cells, a second input coupled with said source of clock signals, a third input coupled with said source of scan mode signals, and having an output coupled to the clock input of said third flip-flop.

17. The combination according to claim 16 wherein said first gate circuit comprises a NOR gate circuit.

18. The combination according to claim 17 wherein said second gate circuit comprises a NOR gate circuit.

* * * * *